(12) United States Patent
Gupta et al.

(10) Patent No.: US 8,699,759 B2
(45) Date of Patent: Apr. 15, 2014

(54) METHOD AND APPARATUS FOR AUTOMATED DETERMINATION OF FEATURES ON AN ELECTRONIC MAP

(75) Inventors: Rajarshi Gupta, Santa Clara, CA (US); Saumitra Mohan Das, San Jose, CA (US); Behrooz Khorashadi, San Jose, CA (US); Min-Wook Jeong, Stanford, CA (US)

(73) Assignee: QUALCOMM Incorporated, San Diego, CA (US)

( * ) Notice: Subject to any disclaimer, the term of this patent is extended or adjusted under 35 U.S.C. 154(b) by 473 days.

(21) Appl. No.: 12/831,979

(22) Filed: Jul. 7, 2010

(65) Prior Publication Data

US 2011/0085707 A1 Apr. 14, 2011

Related U.S. Application Data

(60) Provisional application No. 61/250,837, filed on Oct. 12, 2009.

(51) Int. Cl.
*G06K 9/00* (2006.01)

(52) U.S. Cl.
USPC .......................................................... 382/113

(58) Field of Classification Search
None
See application file for complete search history.

(56) References Cited

U.S. PATENT DOCUMENTS

| 6,415,051 B1 * | 7/2002 | Callari et al. ............... 382/154 |
| 2007/0237395 A1 | 10/2007 | Spencer et al. |
| 2008/0273791 A1 * | 11/2008 | Lee et al. ...................... 382/153 |

FOREIGN PATENT DOCUMENTS

CN 1926401 A 3/2007

OTHER PUBLICATIONS

Jiangeng Du; Yaping Huang; Chen, H.; , "Construct three-dimensional route from blueprint image of building," Audio, Language and Image Processing, 2008. ICALIP 2008. International Conference on , vol., No., pp. 1743-1748, Jul. 7-9, 2008 doi: 10.1109/ICALIP. 2008.4590042 URL: http://ieeexplore.ieee.org/stamp/stamp.jsp?tp=&arnumber=4590042&isnumber=4589.*
Shafer, Steven, Primary Title: A Framework for Creating and Using Maps of Privately Owned Spaces Book Title: Location and Context Awareness Book Series Title: Lecture Notes in Computer Science Copyright: May 2009, Springer.*
"Jiyeong Lee", "A Spatial Access-Oriented Implementation of a 3-D GIS Topological Data Model for Urban Entities", journal = "GeoInformatica", vol. = "8", No. = "3", year = "2004".*
Steven Shafer, A Freamework for Creating and Using Maps of Privately Owned Spaces, LoCA 2009, LNCS 5561, pp. 174-191, 2009, Microsoft Corp., One Microsoft Way, Redmond WA 98052, USA.
Dosch P, et al., "A Complete System for the Analysis of Architectural Drawings", International Journal on Document Analysis and Recognition, Springer, Heidelberg, DE, vol. 3, No. 2, Dec. 1, 2000, pp. 102-116, XP001151691.
International Search Report and Written Opinion—PCT/US2010/052055—International Search Authority, European Patent Office,Jan. 25, 2011.
Taiwan Search Report—TW099134618—TIPO—Sep. 16, 2013.

* cited by examiner

*Primary Examiner* — Stephen R Koziol
*Assistant Examiner* — Amandeep Saini
(74) *Attorney, Agent, or Firm* — Arnold J. Gum

(57) ABSTRACT

The subject matter disclosed herein relates to a system and method for automatically identifying features in an electronic map. In some embodiments, the method may comprise extracting features, which may include entryways and structural elements, from an electronic map. Based on the extracted features, one or more hallways may be identified in the electronic maps by using one or more line segments, which may extend between at least one entryway and one or more structural elements, and/or at least one entryway and one or more other entryways. The electronic map may be updated with one or more annotations identifying the one or more hallways.

32 Claims, 6 Drawing Sheets

METHOD AND APPARATUS FOR AUTOMATED DETERMINATION OF FEATURES ON AN ELECTRONIC MAP

CROSS-REFERENCES TO RELATED APPLICATIONS

This application claims priority to provisional patent application Ser. No. 61/250,837, entitled "Deriving Corridors in a Map," filed on Oct. 12, 2009, assigned to the assignee hereof, and expressly incorporated herein by reference in its entirety.

BACKGROUND

1. Field

The subject matter disclosed herein relates to automated determination of features of an electronic map.

2. Information

Navigation systems are becoming more and more pervasive in today's market. A navigation system may be utilized to determine a route from a first location to a destination. In some navigation systems, a user may enter a start location and a destination into a mapping application, such as one of the different mapping applications commonly used on websites such as Mapquest.com.

Navigation systems may be utilized within an indoor environment, such as a shopping mall, to guide a user to a destination such as a department store or a food court, for example. A user may be provided with navigation instructions informing the user to walk in a particular direction for a certain distance or until a landmark has been reached, such as a bench or hallway, and then change direction. For example, upon reaching a bench, a user may be instructed to turn left and continue walking. Navigation instructions to guide a user from a starting location to a destination may include several segments or branches, for example. For example, a navigation instruction to "walk straight for 50 feet" may comprise a first branch and "turn left and walk straight for 60 feet" may comprise a second branch. In an indoor environment, there may be numerous branches along a particular path from a starting location to an end location or destination.

Information relating to a layout of an indoor environment, such as dimensions of stores, entryways to the stores, or locations of hallways, for example, may be utilized to determine appropriate navigation instructions. For example, if locations of entryways or hallways are known, a user can be directed along a particular path to an entryway of a destination store. However, in some systems, a human operator may identify certain features of an indoor environment on a corresponding map via a time-intensive process.

BRIEF DESCRIPTION OF THE FIGURES

Non-limiting and non-exhaustive features will be described with reference to the following figures, wherein like reference numerals refer to like parts throughout the various figures.

SUMMARY

Figure 1A:
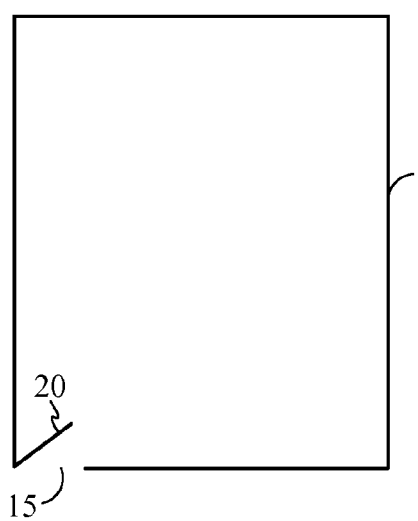
FIGS. 1A and 1B illustrate views of sections of electronic maps having predefined markings for designating entryways to enclosed areas according to one or more implementations.

In one particular implementation, a system and method are provided for automatically determining features of an electronic map. Features may be extracted from an electronic map. One or more hallways may be identified in the electronic map based at least in part on one or more line segments extending between at least one entryway and one or more structural elements or one or more other entryways. The electronic map may be updated with one or more annotations identifying the one or more hallways. It should be understood, however, that this is merely an example implementation, and that claimed subject matter is not limited in this respect.

DETAILED DESCRIPTION

Reference throughout this specification to "one example", "one feature", "an example" or "a feature" means that a particular feature, structure, or characteristic described in connection with the feature and/or example is included in at least one feature and/or example of claimed subject matter. Thus, the appearances of the phrase "in one example", "an example", "in one feature" or "a feature" in various places throughout this specification are not necessarily all referring to the same feature and/or example. Furthermore, the particular features, structures, or characteristics may be combined in one or more examples and/or features.

Some navigation systems utilize electronic maps to determine how to guide a user from a start location to an end location within an indoor environment. Some electronic maps may be generated by scanning office or building blueprints, for example, showing locations of offices, bathrooms, and various other items of interest. In order to determine helpful instructions to guide a user, certain pathways or hallways on electronic maps may initially be identified. A user may be guided through one or more pathways or hallways from a starting location to an end destination.

Some implementations of navigation systems transmit electronic maps for display on a user's mobile device, for example, or on a display screen for a computer. Some navigation systems may determine instructions to guide a user from a starting location to one or more destinations. A navigation application may analyze a basic electronic map to determine how to guide a user from a starting location to an end location, for example. A "basic electronic map," as used herein may refer to an electronic map that includes line segments but may not directly identify locations of certain structural features such as walls, hallways, entryways, or other types of structural partitions, for example. In some implementations, a basic electronic map may include various lines indicative of structural partitions, such as walls, which form rooms as enclosed spaces. However, in some implementations, a basic electronic map may not include annotations to indicate locations of hallways or rooms on the basic electronic map.

In some implementations, a human operator may study basic electronic maps and manually annotate or otherwise identify items such as hallways, offices, entryways, and so forth on the electronic maps. However, using a human operator may be cost-prohibitive in some implementations and also time-intensive. Moreover, if a layout of a structure is altered during subsequent construction phases, a human operator may have to subsequently update basic electronic maps manually over time.

In some implementations, as discussed below, an automated process is implemented to electronically extract or otherwise determine features of an electronic map. For example, basic electronic maps may initially contain only lines showing structural partitions, such as walls, but may not indicate locations of hallways, offices, or entryways. In one or more implementations, a basic electronic map may be analyzed to identify entryways within a structure depicted on the basic electronic map. In some implementations, a basic electronic map may include one or more annotations to identify entryways to enclosure areas within a structure. However, in other implementations there may not be any such annotations to identify entryways within a structure.

In one or more implementations, an image processing method may be implemented to identify entryways. An "entryway," as used herein, may refer to an area or space through which a person may enter or exit another area or space, such as an office or room. For example, an entryway may comprise a doorway through which a door may be opened and/or closed. For example, a structure such as a building may include one or more entryways. In one particular implementation, a building may include several offices or rooms having one or more entryways. An entryway may extend between two structural partitions.

A "structural partition," as used herein may refer to an element capable of physically separating two areas in a structure. For example, a wall in a building extending from a floor to a ceiling, or a portion of a direction between the floor and the ceiling may be considered a structural partition. A structural partition may extend between two entryways, for example.

For example, some basic electronic maps may include a line segment connected to and extending at an angle away from a particular structural partition. By locating such line segments, entryways may be identified. In some implementations, a curved line segment/arc may be attached to perpendicular line segments and a location of an entryway may be determined to be within such an arc. For example, an arc may illustrate a range of movement of a door that is affixed at one end to a structural partition such as a wall. In other implementations, an entryway may be depicted in a different way, for example, such as by use of a dotted line or inclusion of a designated character, such as letter "d," to designate an entryway.

Figure 1B:
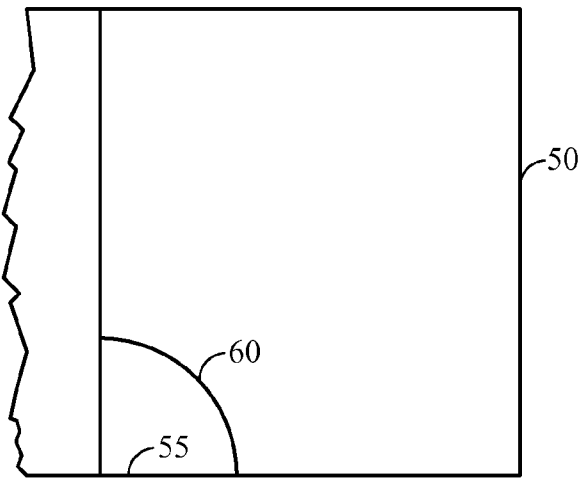

FIGS. 1A and 1B illustrate views of sections of electronic maps having predefined markings for designating entryways to enclosed areas according to one or more implementations. FIG. 1A illustrates an enclosed area 10 having an entryway 15. A line segment 20 extending at an angle from a structural partition or wall of enclosed area 10 in this example indicates a location of entryway 15. For example, line segment 20 may indicate an area through which a door may open or close to allow someone to enter or exit through entryway 15.

FIG. 1B illustrates an enclosed area 50 having an entryway 55. An arc 60 is shown in a corner of enclosed area 50 to indicate a location of entryway 55 in this example. Arc 60 may indicate a range of motion or area through which a door may open or close to allow someone to enter or exit through entryway 55.

After one or more entryways have been identified based at least in part on electronically extracted features such as certain predefined markings, for example, such entryways may be utilized to identify locations of one or more hallways or corridors within a structure, as discussed below with respect to FIGS. 3-9. A "hallway" or "corridor," as used herein may refer to a path extending along a space or area between opposing structural partitions and/or entryways. For example, a person may travel through a first entryway and down a hallway to arrive at a second entryway. If a person is routed from a first location to a second location in a structure such as an office building, for example, the user may travel through one or more hallways.

After hallways have been identified on one or more electronic maps, locations of the hallways may be utilized by a mapping application, for example, to route a user from one location to another in one or more floors of a building or other structure depicted on an electronic map.

Figure 2:
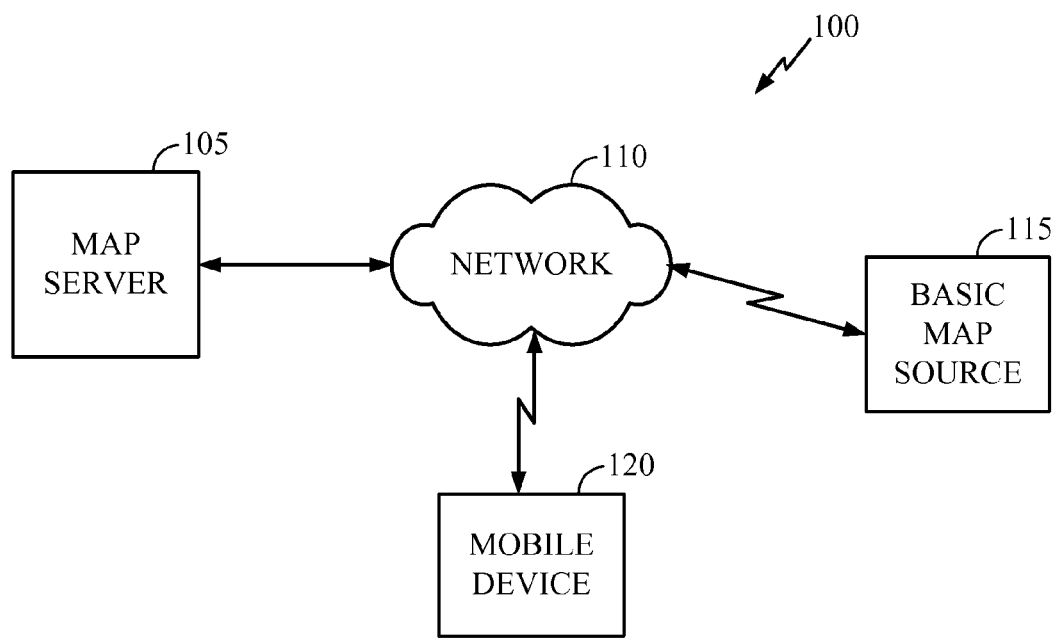
FIG. 2 is a schematic diagram of a navigation system according to one or more implementations.

FIG. 2 is a schematic diagram of a navigation system 100 according to one or more implementations. As shown, navigation system 100 may include a map server 105, a network 110, a basic map source 115, and a mobile device 120. Basic map source 115 may comprise a memory and may store basic electronic maps that may or may not contain any annotations or other information indicating locations of entryways or hallways/corridors, for example. Basic electronic maps may include drawings of line segments or arcs which may be identified as representing one or more entryways or hallways.

In one implementation, as discussed above, basic map source 115 may create basic electronic maps by scanning paper blueprints for a building into an electronic format that does not include any annotations. Alternatively, basic map source 115 may acquire basic electronic maps from an architectural firm that designed a building or from public records, for example.

Basic electronic maps may be transmitted by basic map source 115 to map server 105 via network 110. Basic map source 115 may comprise a database or server, for example. In one implementation, map server 105 may transmit a request for a particular basic electronic map to basic map source 115 and in response the particular basic electronic map may be transmitted to map server 105. One or more basic maps in basic map source 115 may be scanned from blueprint or other documents, for example.

Map server 105 may analyze one or more basic electronic maps to identify entryways, hallways, or other items on the basic electronic maps. Such analysis may be performed via a digital image processing analysis of a basic electronic map. For example, map server 105 may perform such image processing. If entryways or hallways are identified, information regarding such entryways or hallways may be added to a basic electronic map as an annotation, for example.

If hallways and/or entryways have been identified for a particular electronic map, the electronic map may subsequently be utilized by a navigation system to provide routing directions or instructions to guide a person from a starting location depicted on a map to a destination location in an office, shopping mall, stadium, or other indoor environment. As discussed above, a person may be guided through one or more hallways to reach a destination location. Electronic maps and/or routing directions may be transmitted to a user's mobile device 120. For example, such electronic maps and/or routing directions may be presented on a display screen. Routing directions may also be audibly presented to a user via a speaker of mobile device 120 or in communication with mobile device 120. Map server 105, basic map source 115 and mobile device 120 may be separate devices or combined in various combinations (e.g., all combined into mobile device 120; basic map source 115 combined into map server 105, etc.).

Figure 3:
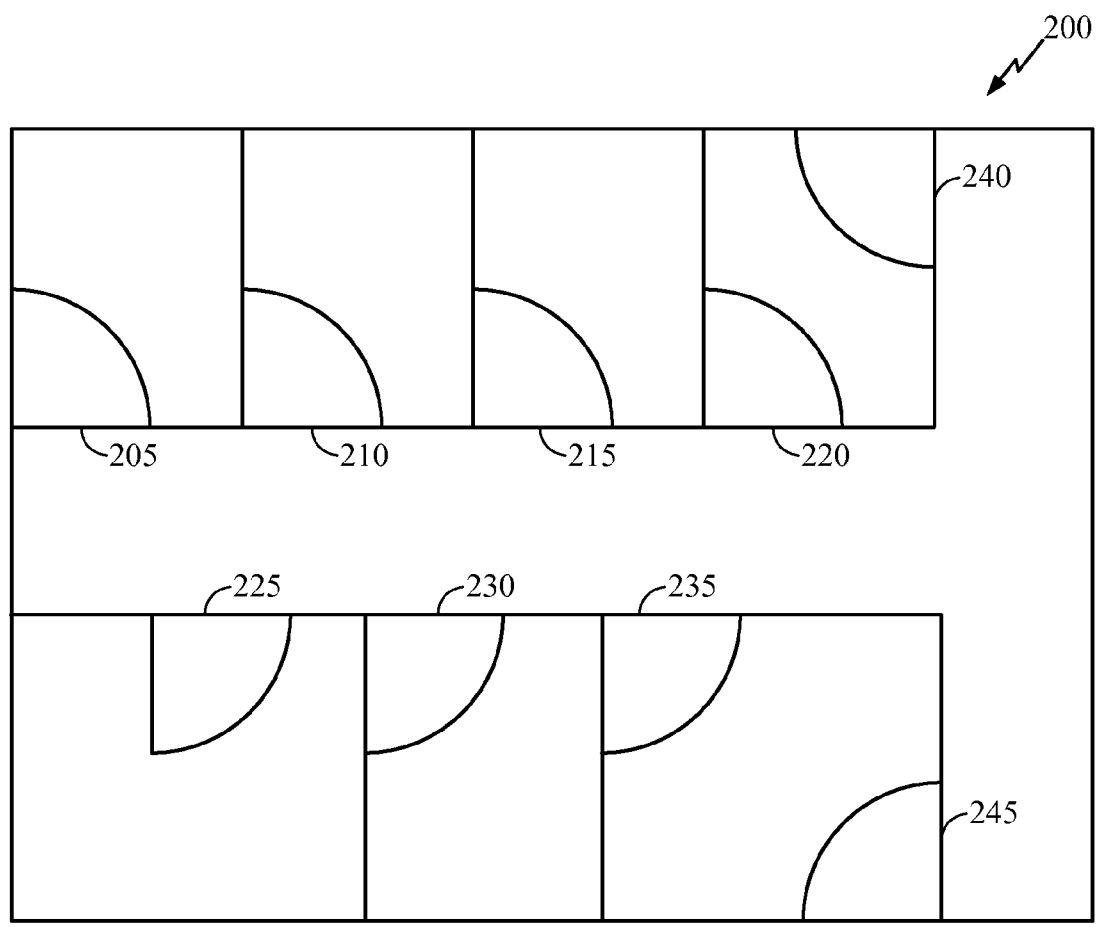
FIG. 3 is a view of an electronic map according to one implementation.

FIG. 3 is a view of an electronic map 200 according to one implementation. As shown, electronic map 200 includes various elements which a human being may view and readily identify. However, such elements may not be as easily identified via an automated process, for example. Electronic map 200 may be analyzed to initially identify structural partitions, such as walls, and entryways. A predefined nomenclature or predefined markings may be utilized to represent entryways in electronic maps, as discussed above with respect to FIGS. 1A and 1B.

Figure 4:
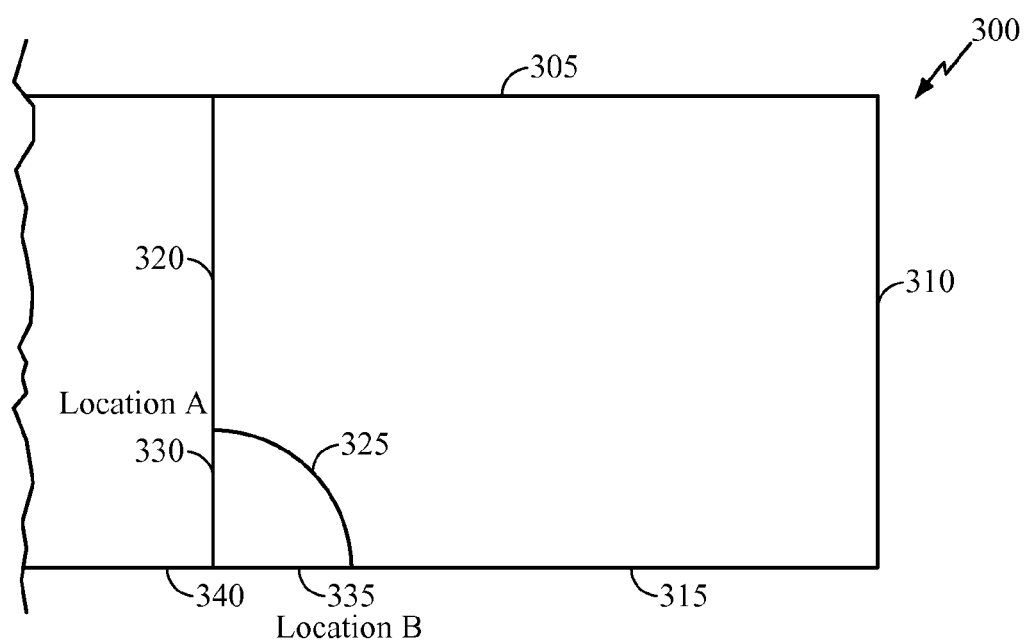
FIG. 4 illustrates a view of a section of an electronic map according to one implementation.

FIG. 4 illustrates a view of a section 300 of an electronic map according to one implementation. After an electronic map is initially received from a basic map source, the electronic map may be analyzed/processed by a map server to identify entryways and structural partitions displayed on the electronic map. If section 300 is processed by a map server, structural partitions 305, 310, 315, and 320 may be identified. For example, a presence of a line segment extending at least a threshold distance may be representative of a structural partition. In computer aided drafting (CAD) files, for example, an annotation layer may specify that line segments shown within a layer comprise a wall. However, long line segments (e.g., such as those in a bitmap image) may also identify walls.

Section 300 may also be processed to identify one or more entryways. In this example, a presence of an arced line extending between two structural partitions may be located. As shown, an arced line 325 extends between structural partitions 320 and 315. In the example shown in FIG. 4, a structural partition may extend above an entryway. Accordingly, a location of an entryway and of a structural partition may overlap in some electronic maps. An entryway may be located at either location A 330 overlapping with a portion of structural partition 320 or at location B 335 overlapping with a portion of structural partition 315. In order to determine whether an entryway is located at location A 330 or location B 335, or both in some instances, adjacent sections of an electronic map may be processed to determine a most likely location of an entryway. For example, if there is a row of rooms located adjacent to one another in a section of an electronic map, entryways leading into the rooms are likely to be located on the same side, e.g., facing a hallway. In this example, an entryway may be determined to be located at location B 335 if structural partition 340 is identified as being connected to structural partition 320 and being parallel to and extending in a direction away from structural partition 315.

Referring back to FIG. 3, entryways and structural partitions for electronic map 200 may be determined via a process similar to that discussed above with respect to FIG. 4. As shown, entryways 205, 210, 215, 220, 225, 230, 235, 240, and 245 may be identified. After entryways have been identified, locations of such entryways may be utilized to identify locations of hallways within an electronic map.

One method for identifying one of more hallways depicted on an electronic map is to select a particular entryway and project a straight line segment from the entryway to some or all of the other entryways shown on the electronic map. If a line segment projected from a particular entryway to another entryway does not intersect any structural partitions and does not extend between entryways within the same room, office, or enclosed area, then the two entryways are in a line-of-sight.

Figure 5:
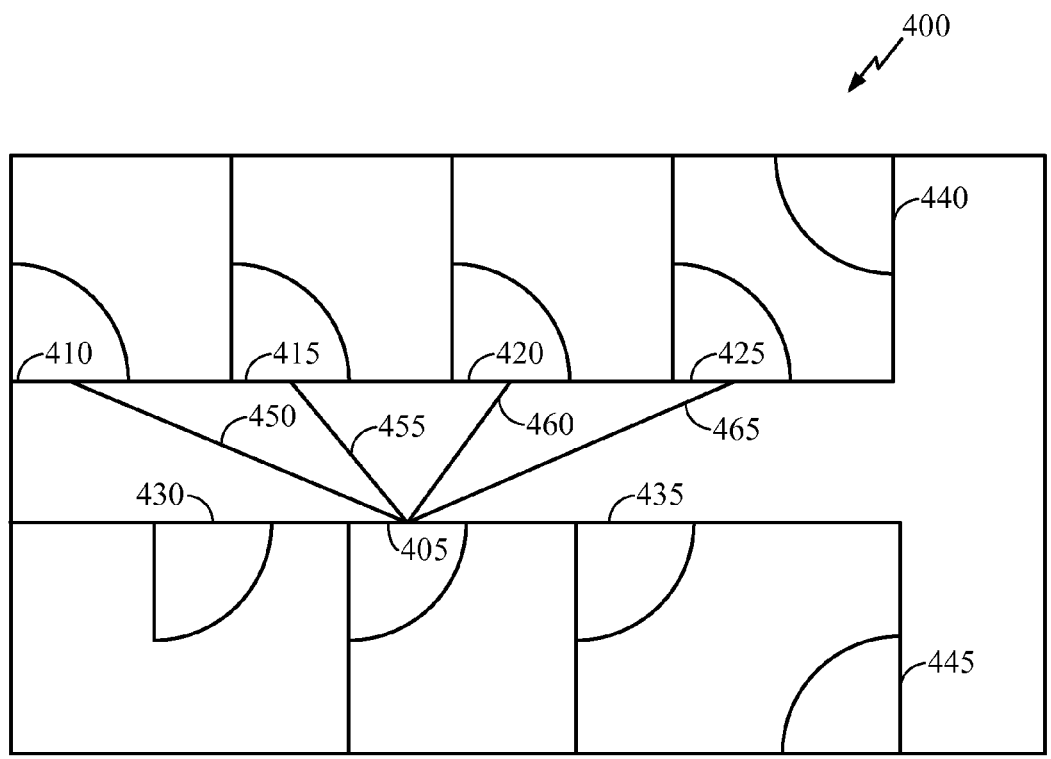
FIG. 5 illustrates a view of an electronic map showing entryways within a line-of-sight of an entryway according to one or more implementations.

FIG. 5 illustrates a view of an electronic map 400 showing entryways within a line-of-sight of entryway 405 according to one or more implementations. As shown, entryways 410, 415, 420, and 425 are each within a line-of-light of entryway 405. Entryways 430, 435, 440, and 445, on the other hand, are not within a line-of-sight of entryway 405. Line segments 450, 455, 460, and 465 extend from entryway 405 to entryways 410, 415, 420, and 425, respectively. Midpoints of line segments 450, 455, 460, and 465 may subsequently be determined If a substantially straight line is capable of being projected through three or more of such midpoints, the substantially straight line may indicate the presence of a hallway extending along the line. Such a process may identify a hallway or a section of a hallway that is substantially straight, e.g., not curved. If, however, a hallway or section of a hallway is curved, such a process may be utilized to separately identify different straight sections of the hallway if there are any straight sections.

FIG. 5 illustrates a method in which there are four entryways within line-of-sight of entryway 405 and a hallway may be determined based on midpoints of line segments extending between such line-of-sight entryways. As discussed above, such a process may be utilized for entryways within line-of-sight that are not within the same room, office, or other enclosed area. If there are only one or two entryways within a line-of-sight of a particular entryway, line segments may be projected from more than one entryway to other entryways within a line-of-sight. After such line segments have been projected, a line may be projected through respective midpoints of such line segments to identify a location of a hallway.

Figure 6:
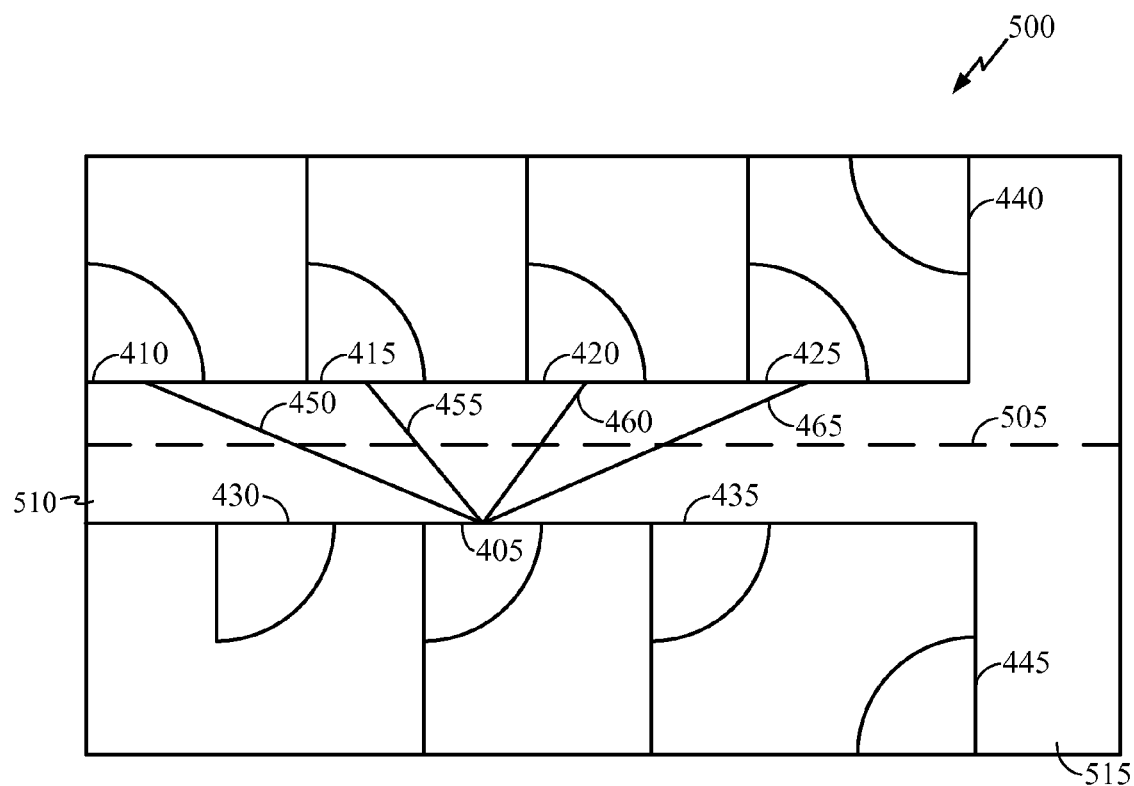
FIG. 6 illustrates a view of an electronic map showing a hallway identified according to one or more implementations.

FIG. 6 illustrates a view of an electronic map 500 showing a hallway 505 identified according to one or more implementations. In FIG. 6, a line 505 is shown projected through respective midpoints of line segments 450, 455, 460, and 465 extending between entryway 405 and entryways 410, 415, 420, and 425, respectively. If a hallway is straight and structural partitions and entryways on opposing sides of the hallway are parallel to the hallway, respective midpoints of line segments 450, 455, 460, and 465 may be located in the middle of the hallway such that line 505 may be projected through such midpoints. Line 505 may be extended until it reaches any structural partitions. After line 505 has been projected, a hallway 510 extending along line 505 may be identified.

Although hallway 505 has been identified, there is a second hallway 515 shown in FIG. 6 that may be identified. As shown, there are two entryways 440 and 445 located along hallway 515. However, there are no entryways within line-of-sight of either of entryways 440 or 445. Accordingly, a method as discussed above with respect to FIGS. 5 and 6 may not be applicable to identify hallway 515. Instead, a method as discussed below with respect to FIG. 7 may be utilized to identify hallway 515.

Figure 7:
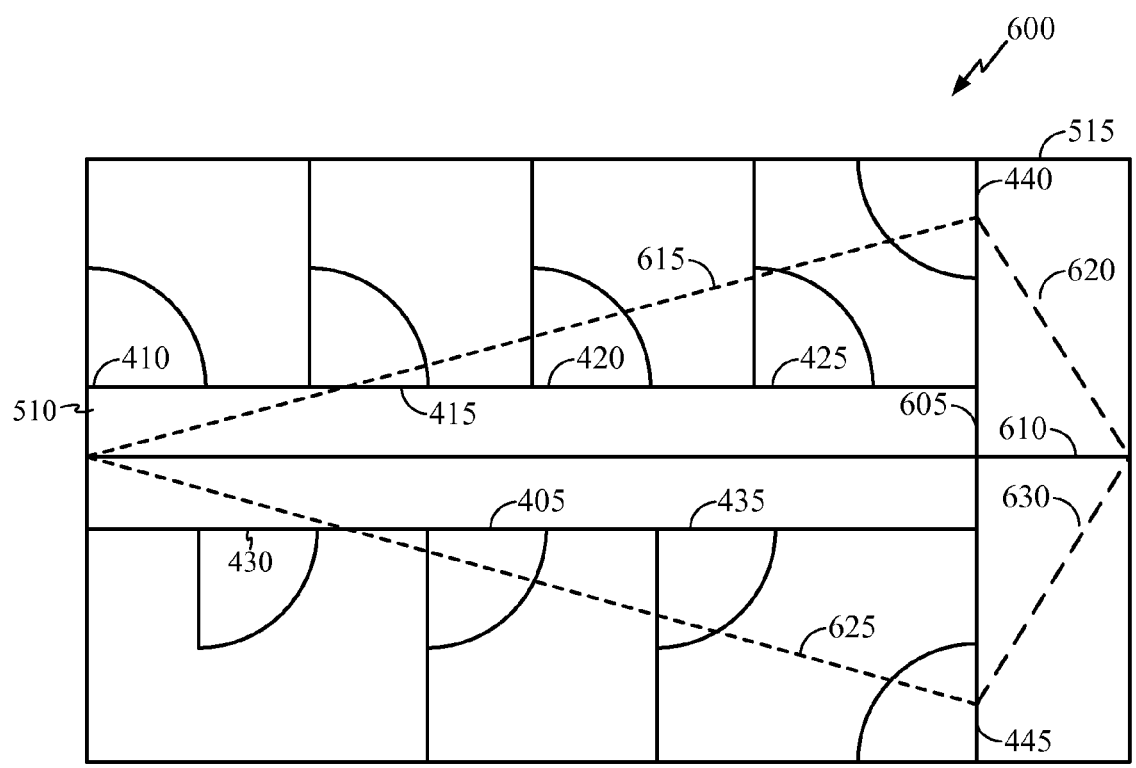
FIG. 7 illustrates a view of an electronic map according to one or more implementations.

FIG. 7 illustrates a view of an electronic map 600 according to one or more implementations. FIG. 7 shows an implementation of a method for identifying hallway 515 or any hallway where entryways are located on only one side, for example, a common side of the hallway. First, a line is projected between two entryways. In this example, a line 605 is projected between entryway 440 and entryway 445 and extended until structural partitions are reached on each end of line 605. Next, a substantially perpendicular bisector of line 605 is determined and a perpendicular bisector line 610 is projected through a midpoint of line 605 and is extended in a direction substantially perpendicular to line 605 until structural partitions are reached on each end of the line 610. Next, line segments 615, 620, 625, and 630 are projected between each end of line 610 and respective midpoints of entryways 440 and 445. If two adjacent line segments do not cross through any structural partitions, then it may be inferred that there is a direct path extending between the entryways 440 and 445. In this example, line segments 620 and 630 are unobstructed. Therefore, it can be deduced that hallway 515 may extend through a space in which line segments 620 and 630 are located. In other words, as shown in FIG. 7, line segment 630 extends from entryway 445 to an end of perpendicular bisector line 610, and line segment 620 extends from entryway 440 to the same end of perpendicular bisector line 610. Accordingly, hallway 515 may possibly extend through a space in which line segments 620 and 630 are located.

Hallway 515 may therefore be identified based at least in part on direct accessibility of entryways 440 and 445 to a common point associated with respective ends of line segments 620 and 630. Such a common point may comprise a point at which line segments 620 and 630 join at an end of line 610 as shown in FIG. 7.

Figure 8:
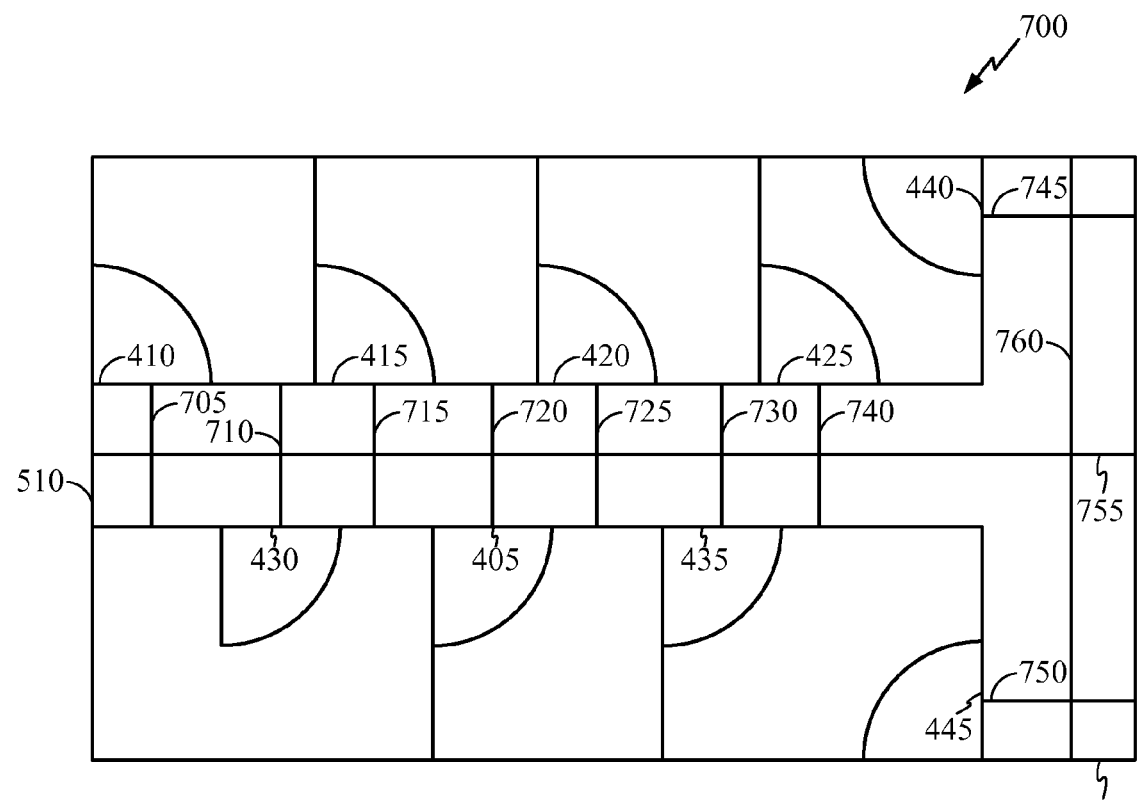
FIG. 8 illustrates a view of an electronic map according to one or more implementations.

FIG. 8 illustrates a view of an electronic map 700 according to one or more implementations. FIG. 8 illustrates an implementation of a method for identifying a hallways based at least in part on midpoints of line segments extending between entryways and opposing structural partitions or other entryways. In FIG. 8, perpendicular line segments are projected away from entryways, extending until they reach an opposing structural partition or entryway. If a line is subsequently projected through respective midpoints of such line segments and extended until structural partitions are reached at each end of the line, such a line may indicate a center of a hallway.

In FIG. 8, line segments 705, 710, 715, 720, 725, 730, 740, 745, and 750 are projected extending away from entryways toward an opposing structural partition or entryway. A first line 755 may be projected through midpoints of line segments 705, 710, 715, 720, 725, 730, and 740, and a second line 760 may be projected through midpoints of line segments 745 and 750. A first hallway 510 may extend along first line 755 and a second hallway 515 may extend along second line 760.

Figure 9:
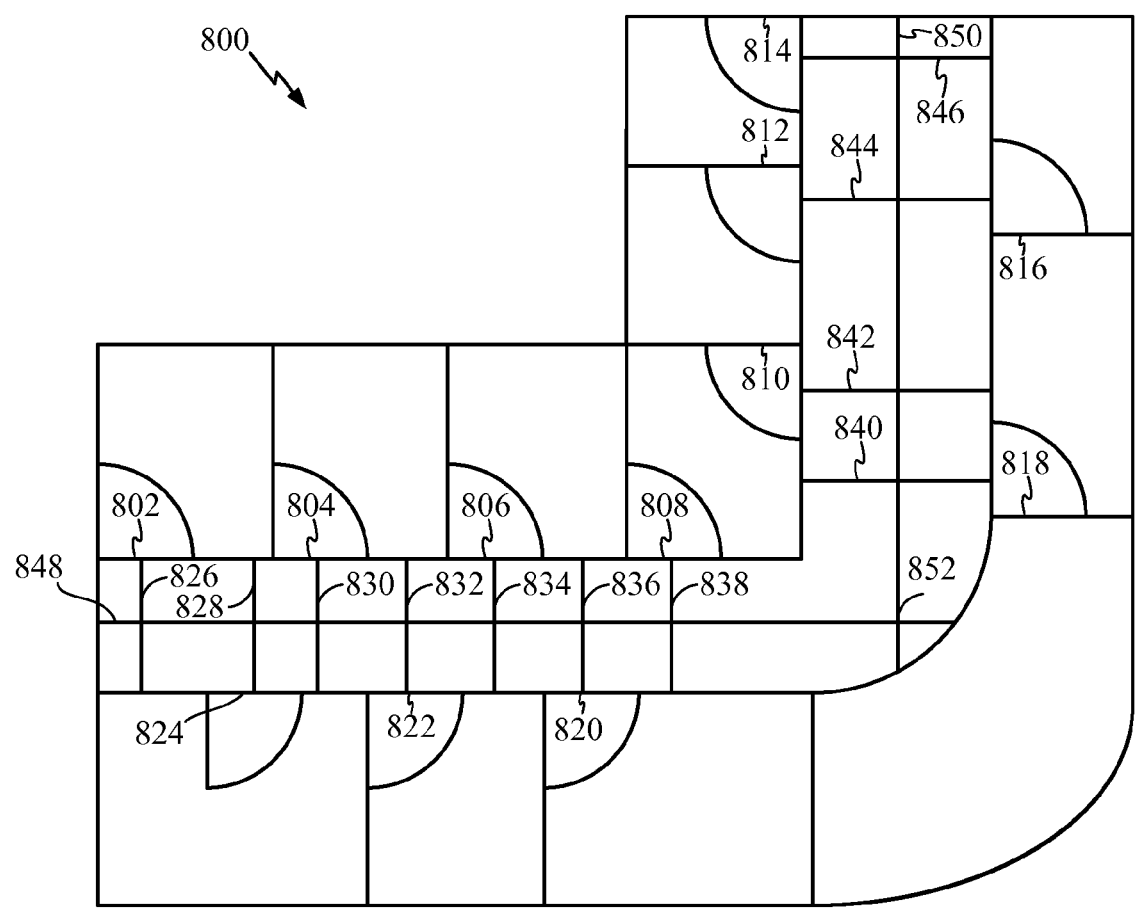
FIG. 9 illustrates a view of an electronic map depicting a curved hallway according to one or more implementations.

A method of using perpendicular line segments to identify hallways may be useful for identifying hallways that are curved. FIG. 9 illustrates a view of an electronic map 800 depicting a curved hallway according to one or more implementations. Entryways 802, 804, 806, 808, 810, 812, 814, 816, 818, 820, 822, and 824 are shown in FIG. 9. Perpendicular line segments may be projected away from entryways, toward an opposing structural partition or entryway. For example, line segments 826, 828, 830, 832, 834, 836, 838, 840, 842, 844, and 846 are illustrated. Midpoints of such line segments may be determined and then straight lines may be projected through such midpoints. In this example, line 848 may be projected, extending through midpoints of line segments 826, 828, 830, 832, 834, 836, and 838. Line 848 may be extended until structural partitions are reached on each end. Line 850 may be projected through line segments 840, 842, 844, and 846. Line 850 may be extended until structural partitions are reached on each end.

FIG. 9 illustrates a curved hallway. Lines 850 and 848 intersect at point 852. Based on a location of point 852, a determination may be made that a first hallway extends along line 848 and a second hallway extends along line 850. Such lines may therefore be utilized to determine respective locations of one or more hallways.

Various implementations as discussed above with respect to FIGS. 1-9 may therefore be utilized to determine locations of entryways and hallways. When an electronic map is analyzed, various line segments or predefined markings indicative of structural partitions or entryways, for example, may be identified and related to a corresponding Cartesian grid. Locations of various structural elements on a Cartesian grid may be utilized to determine locations of hallways on an electronic map. For example, an electronic map may be modeled using sets of linear and/or non-linear equations on an electronic computing platform. For example, the projection and/or extension of line segments from an entryway may be modeled with sets of linear and non-linear equations on an electronic computing platform.

Figure 10:
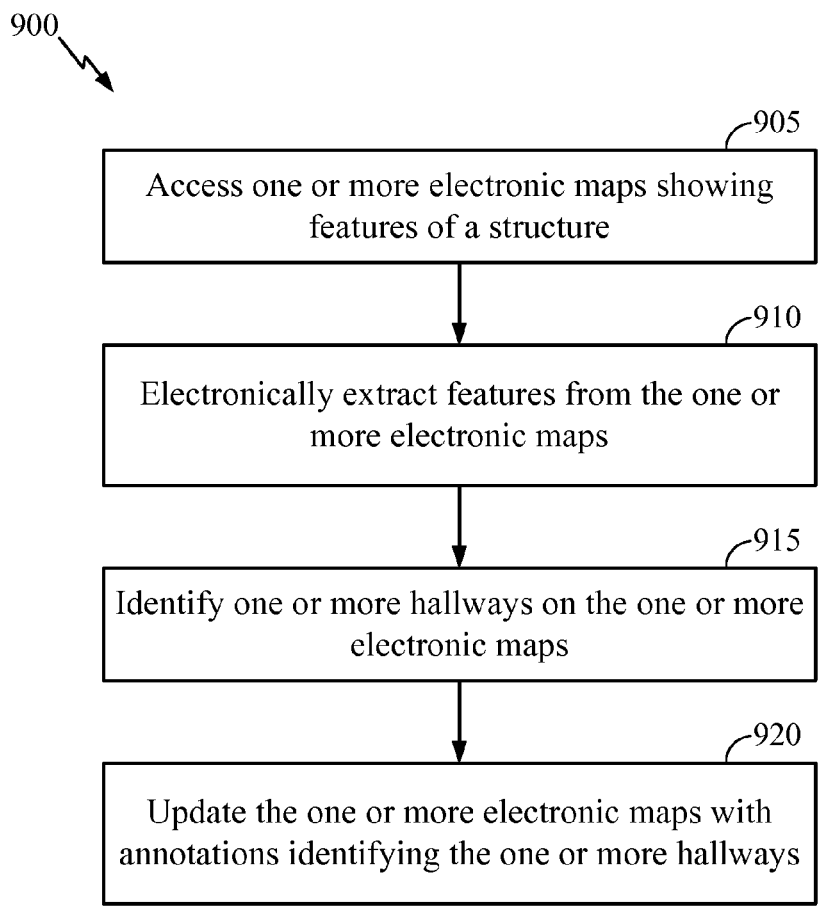
FIG. 10 is a flow diagram of a process for identifying one or more hallways on an electronic map according to one or more implementations.

FIG. 10 is a flow diagram of a process 900 for identifying one or more hallways on an electronic map according to one or more implementations. For example, process 900 may be implemented by a map server. First, at operation 905, one or more electronic maps showing features of a structure may be accessed or received from a database of electronic maps, for example. Next, at operation 910, features from one or more electronic maps may be electronically extracted. For example, an image processing application program may be utilized to electronically extract such features. At operation 915, one or more hallways on the one or more electronic maps may be identified. For example, such hallways may be identified based at least in part on one or more line segments extending between at least one electronically extracted entryway and one or more electronically extracted structural elements or one or more other entryways based at least in part on the features. At operation 920, the one or more electronic maps may be updated with one or more annotations identifying the one or more hallways.

Figure 11:
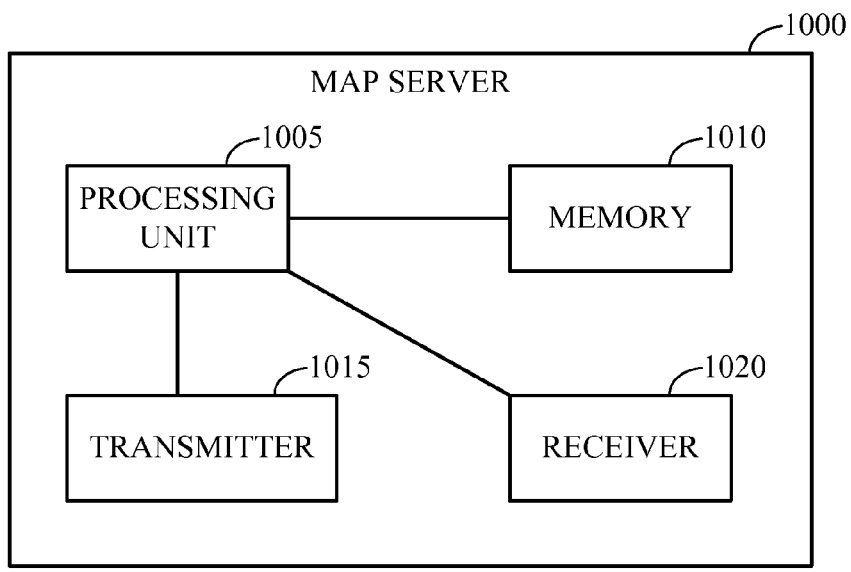
FIG. 11 is a schematic block diagram of a particular implementation of a map server according to one implementation.

FIG. 11 is a schematic block diagram of a particular implementation of a map server 1000 according to one implementation. Map server 1000 may include a processing unit 1005, memory 1010, transmitter 1015, and receiver 1020, for example. Memory 1010 may be adapted to store machine-readable instructions, which are executable to perform one or more of processes, implementations, or examples thereof which have been described or suggested. Processing unit 1005 may be adapted to access and execute such machine-readable instructions. Through execution of these machine-readable instructions, processing unit 1005 may direct various elements of map server 1000 to perform one or more functions.

Memory 1010 may also store basic electronic maps to be analyzed by processing unit 1005 to determine locations of entryways and hallways and update such electronic maps with one or more annotations. Transmitter 1015 may transmit one or more electronic maps to another device, such as a user's mobile device. Upon receipt of such electronic maps, a user's mobile device may present updated electronic maps via a display device, for example. Receiver 1020 may receive one or more basic electronic maps for analysis from a basic electronic map source, for example.

Some portions of the detailed description above are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular functions pursuant to instructions from program software. Algorithmic descriptions or symbolic representations are examples of techniques used by those of ordinary skill in the signal processing or related arts to convey the substance of their work to others skilled in the art. An algorithm is here, and generally, considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated.

It has proven convenient at times, principally for reasons of common usage, to refer to such signals as bits, data, values, elements, symbols, characters, terms, numbers, numerals or the like. It should be understood, however, that all of these or similar terms are to be associated with appropriate physical quantities and are merely convenient labels. Unless specifically stated otherwise, as apparent from the above discussion, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device. For example, a specific computing apparatus may comprise one or more processing units programmed with instructions to perform one or more specific functions.

As used herein, a mobile device refers to a device such as a cellular or other wireless communication device (such as a mobile phone), personal communication system (PCS) device, personal navigation device (PND), Personal Information Manager (PIM), Personal Digital Assistant (PDA), laptop, tablet, netbook, smartbook, or other suitable device which is capable of receiving wireless communication and/or navigation signals. The term "mobile device" is also intended to include devices which communicate with a personal navigation device (PND), such as by short-range wireless, infrared, wireline connection, or other connection—regardless of whether satellite signal reception, assistance data reception, and/or position-related processing occurs at the device or at the PND. Also, "mobile device" is intended to include all devices, including wireless communication devices, computers, laptops, etc. which are capable of communication with a server, such as via the Internet, Wi-Fi, or other network, and regardless of whether satellite signal reception, assistance data reception, and/or position-related processing occurs at the device, at a server, or at another device associated with the network. Any operable combination of the above are also considered a "mobile device."

Methodologies described herein may be implemented by various means depending upon applications according to particular features and/or examples. For example, such methodologies may be implemented in hardware, firmware, software, and/or combinations thereof. In an implementation involving hardware, for example, a processing unit may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other units designed to perform the functions described herein, and/or combinations thereof.

For an implementation involving firmware and/or software, certain methodologies may be implemented with modules (e.g., procedures, functions, and so on) that perform the functions described herein. Any machine readable medium tangibly embodying instructions may be used in implementing the methodologies described herein. For example, software codes may be stored in a memory of a mobile device, an access point/femtocell, a server, etc. and executed by a processing unit of the device. Memory may be implemented within a processing unit and/or external to the processing unit. As used herein the term "memory" refers to any type of long term, short term, volatile, nonvolatile, or other memory and is not to be limited to any particular type of memory or number of memories, or type of media upon which memory is stored.

If an implementation involves firmware and/or software, the functions may be stored as one or more instructions or code on a computer-readable medium. Examples include computer-readable media encoded with a data structure and computer-readable media encoded with a computer program. A computer-readable medium may take the form of an article of manufacture. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processing units to implement the functions outlined in the claims. That is, the communication apparatus includes transmission media with signals indicative of information to perform disclosed functions. At a first time, the transmission media included in the communication apparatus may include a first portion of the information to perform the disclosed functions, while at a second time the transmission media included in the communication apparatus may include a second portion of the information to perform the disclosed functions.

"Instructions" as referred to herein relate to expressions which represent one or more logical operations. For example, instructions may be "machine-readable" by being interpretable by a machine for executing one or more operations on one or more data objects. However, this is merely an example of instructions and claimed subject matter is not limited in this respect. In another example, instructions as referred to herein may relate to encoded commands which are executable by a processing unit having a command set which includes the encoded commands. Such an instruction may be encoded in the form of a machine language understood by the processing unit. Again, these are merely examples of an instruction and claimed subject matter is not limited in this respect.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of appended claims, and equivalents thereof.

What is claimed is:

1. A method, comprising:
accessing one or more electronic maps showing features of a structure;
electronically extracting features from the one or more electronic maps, wherein the extracted features comprise entryways, wherein locations of one or more of the entryways are unknown prior to extraction;
identifying, based, at least in part, on the extracted features, one or more hallways on the one or more electronic maps by projecting one or more line segments extending between:
at least one entryway and one or more structural elements, or
the at least one entryway and one or more other entryways; and
updating the one or more electronic maps with one or more annotations identifying the one or more hallways.

2. The method of claim 1, wherein the one or more structural elements comprise at least one structural partition extending between a first entryway and at least a second entryway.

3. The method of claim 1, further comprising identifying the at least one entryway based at least in part on the extracted features.

4. The method of claim 1, wherein the one or more electronic maps are accessible from a memory device.

5. The method of claim 1, wherein the identifying the one or more hallways comprises extending first line segments between at least one of the one or more entryways and at least two other entryways, identifying respective midpoints of the first line segments, and extending a second line segment through the respective midpoints of the first line segments.

6. The method of claim 1, wherein the identifying one or more hallways comprises extending perpendicular first line segments from at least three entryways to the structural elements and extending a second line segment through the perpendicular first line segments.

7. The method of claim 1, further comprising
determining a first line segment extending through at least two entryways located on a common side of a hallway and extending the line segment between first respective ends of the structure;
determining a perpendicular bisector of the first line segment and extending a second line segment in a direction perpendicular to the first line segment between second respective ends of the structure;
determining a set of third line segments extending between the at least two entryways and the second respective ends of the structure; and
identifying the hallway based at least in part on direct accessibility of the entryways to a common point associated with respective ends of the third line segments.

8. The method of claim 1, further comprising transmitting at least one of the one or more updated electronic maps to a mobile device.

9. The method of claim 8, further comprising presenting at least one or more updated electronic maps on a display of the mobile device.

10. An apparatus, comprising:
a receiver to receive one or more electronic maps showing features of a structure; and
a processing unit adapted to:
electronically extract features from the one or more electronic maps, wherein the extracted features comprise entryways and wherein locations of one or more of the entryways are unknown prior to extraction;
identify, based, at least in part, on the extracted features, one or more hallways on the one or more electronic maps by projecting one or more line segments extending between:
at least one entryway and one or more structural elements, or
the at least one entryway and one or more other entryways; and
update the one or more electronic maps with one or more annotations identifying the one or more hallways.

11. The apparatus of claim 10, wherein the one or more structural elements comprise at least one structural partition extending between a first entryway and at least a one second entryway.

12. The apparatus of claim 10, wherein the processing unit is further adapted to identify the at least one entryway based at least in part on the extracted features.

13. The apparatus of claim 10, wherein the processing unit is further adapted to identify the one or more hallways by extending first line segments between at least one of the one or more entryways and at least two other entryways, identifying respective midpoints of the first line segments, and extending a second line segment through the respective midpoints of the first line segments.

14. The apparatus of claim 10, wherein the processing unit is further adapted to identify the one or more hallways by extending perpendicular first line segments from at least three entryways to the structural elements and extending a second line segment through the perpendicular first line segments.

15. The apparatus of claim 10, wherein the processing unit is further adapted to:
determine a first line segment extending through at least two entryways located on a common side of a hallway and extending the line segment between first respective ends of the structure;
determine a perpendicular bisector of the first line segment and extending a second line segment in a direction perpendicular to the first line segment between second respective ends of the structure;
determine a set of third line segments extending between the at least two entryways and the second respective ends of the structure; and
identify the hallway based at least in part on direct accessibility of the entryways to a common point associated with respective ends of the third line segments.

16. The apparatus of claim 10, further comprising a transmitter to transmit at least one of the one or more updated electronic maps to a mobile device.

17. An apparatus, comprising:
means for accessing one or more electronic maps showing features of a structure;
means for electronically extracting features from the one or more electronic maps, wherein the extracted features comprise entryways wherein locations of one or more of the entryways are unknown prior to extraction;
means for identifying, based, at least in part, on the extracted features, one or more hallways on the one or more electronic maps by projecting one or more line segments extending between:

at least one entryway and one or more structural elements, or the at least one entryway and one or more other entryways; and means for updating the one or more electronic maps with one or more annotations identifying the one or more hallways.

18. The apparatus of claim 17, wherein the one or more structural elements comprise at least one structural partition extending between a first entryway and at least a second entryway.

19. The apparatus of claim 17, further comprising means for identifying the at least one entryway based at least in part on the extracted features.

20. The apparatus of claim 17, further comprising means for identifying the one or more hallways by extending first line segments between at least one of the one or more entryways and at least two other entryways, identifying respective midpoints of the first line segments, and extending a second line segment through the respective midpoints of the first line segments.

21. The apparatus of claim 17, further comprising means for identifying the one or more hallways by extending perpendicular first line segments from at least three entryways to the structural elements and extending a second line segment through the perpendicular first line segments.

22. The apparatus of claim 17, further comprising:

means for determining a first line segment extending through at least two entryways located on a common side of a hallway and extending the line segment between first respective ends of the structure;

means for determining a perpendicular bisector of the first line segment and extending a second line segment in a direction perpendicular to the first line segment between second respective ends of the structure;

means for determining a set of third line segments extending between the at least two entryways and the second respective ends of the structure; and means for identifying the hallway based at least in part on direct accessibility of the entryways to a common point associated with respective ends of the third line segments.

23. The apparatus of claim 17, further comprising means for transmitting at least one of the one or more updated electronic maps to a mobile device.

24. An article, comprising:

a non-transitory computer-readable storage medium comprising machine-readable instructions executable by a special purpose apparatus to:

access one or more electronic maps showing features of a structure;

electronically extract features from the one or more electronic maps, wherein the extracted features comprise entryways, wherein locations of one or more of the entryways are unknown prior to extraction;

identify, based, at least in part, on the extracted features, one or more hallways on the one or more electronic maps by projecting one or more line segments extending between:

at least one entryway and one or more structural elements, or the at least one entryway and one or more other entryways; and update the one or more electronic maps with one or more annotations identifying the one or more hallways.

25. The article of claim 24, wherein the one or more structural elements comprise at least one structural partition extending between a first entryway and at least a second entryway.

26. The article of claim 24, wherein the machine-readable instructions are further executable by the special purpose apparatus to identify the at least one entryway based at least in part on the extracted features.

27. The article of claim 24, wherein the machine-readable instructions are further executable by the special purpose apparatus to identify the one or more hallways by extending first line segments between at least one of the one or more entryways and at least two other entryways, identifying respective midpoints of the first line segments, and extending a second line segment through the respective midpoints of the first line segments.

28. The article of claim 24, wherein the machine-readable instructions are further executable by the special purpose apparatus to identify the one or more hallways by extending perpendicular first line segments from at least three entryways to the structural elements and extending a second line segment through the perpendicular first line segments.

29. The article of claim 24, wherein the machine-readable instructions are further executable by the special purpose apparatus to:

determine a first line segment extending through at least two entryways located on a common side of a hallway and extending the line segment between first respective ends of the structure;

determine a perpendicular bisector of the first line segment and extending a second line segment in a direction perpendicular to the first line segment between second respective ends of the structure;

determine a set of third line segments extending between the at least two entryways and the second respective ends of the structure; and identify the hallway based at least in part on direct accessibility of the entryways to a common point associated with respective ends of the third line segments.

30. The article of claim 24, wherein the machine-readable instructions are further executable by the special purpose apparatus to initiate transmission of at least one of the one or more updated electronic maps to a mobile device.

31. The method of claim 1, wherein the projection of line segments is modeled using linear equations.

32. The apparatus of claim 10, wherein the projection of line segments is modeled using linear equations.

* * * * *